United States Patent
Kouno et al.

(10) Patent No.: US 12,416,681 B2
(45) Date of Patent: Sep. 16, 2025

(54) BATTERY STATE ESTIMATION DEVICE AND POWER SYSTEM

(71) Applicant: HITACHI HIGH-TECH CORPORATION, Tokyo (JP)

(72) Inventors: Toru Kouno, Tokyo (JP); Emha Bayu Miftahullatif, Tokyo (JP); Hiroya Fujimoto, Tokyo (JP); Yutaka Ueda, Tokyo (JP); Katsutoshi Kondo, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 115 days.

(21) Appl. No.: 18/286,596

(22) PCT Filed: Feb. 24, 2022

(86) PCT No.: PCT/JP2022/007644
§ 371 (c)(1),
(2) Date: Oct. 12, 2023

(87) PCT Pub. No.: WO2022/230335
PCT Pub. Date: Nov. 3, 2022

(65) Prior Publication Data
US 2024/0210485 A1    Jun. 27, 2024

(30) Foreign Application Priority Data
Apr. 28, 2021 (JP) ................... 2021-076220

(51) Int. Cl.
*G01R 31/392* (2019.01)
*G01R 31/3835* (2019.01)
*G01R 31/389* (2019.01)

(52) U.S. Cl.
CPC ....... *G01R 31/392* (2019.01); *G01R 31/3835* (2019.01); *G01R 31/389* (2019.01)

(58) Field of Classification Search
None
See application file for complete search history.

(56) References Cited

U.S. PATENT DOCUMENTS

2014/0088898 A1* 3/2014 Lim .................... G01R 31/392
                                                          702/63
2020/0088807 A1    3/2020 Ikeda et al.
(Continued)

FOREIGN PATENT DOCUMENTS

JP    2016-145795 A    8/2016
JP    2018-156759 A    10/2018
(Continued)

OTHER PUBLICATIONS

Australian Office Action received in corresponding Australian Application No. 2022263786 dated Aug. 28, 2024.
(Continued)

*Primary Examiner* — Jas A Sanghera
(74) *Attorney, Agent, or Firm* — MATTINGLY & MALUR, PC

(57) ABSTRACT

The purpose of the present invention is to provide a technique capable of accurately estimating SOH without relying on a calculation standard of a capacity change when obtaining the SOH. The battery state estimation device according to the present invention specifies a first period and a second period in a stop period after a battery has completed charging or discharging and refers to the relationship between an estimated value of the state of health of the battery and a measured value of the state of health, thereby estimating the measured value, said estimated value being obtained using the difference between the output voltages in the second period (refer to FIG. 5A).

11 Claims, 18 Drawing Sheets

(56) References Cited

U.S. PATENT DOCUMENTS

2022/0381846 A1 12/2022 Miftahullatif et al.
2023/0349981 A1 11/2023 Miftahullatif et al.

FOREIGN PATENT DOCUMENTS

| JP | 2020-169943 A | 10/2020 |
|---|---|---|
| WO | 2021/065443 A1 | 4/2021 |
| WO | 2022/024235 A1 | 2/2022 |

OTHER PUBLICATIONS

International Search Report of PCT/JP2022/007644 dated Apr. 19, 2022.
Extended European Search Report received in corresponding European Application No. 22795258.7 dated Apr. 4, 2025.

* cited by examiner

FIG. 5A
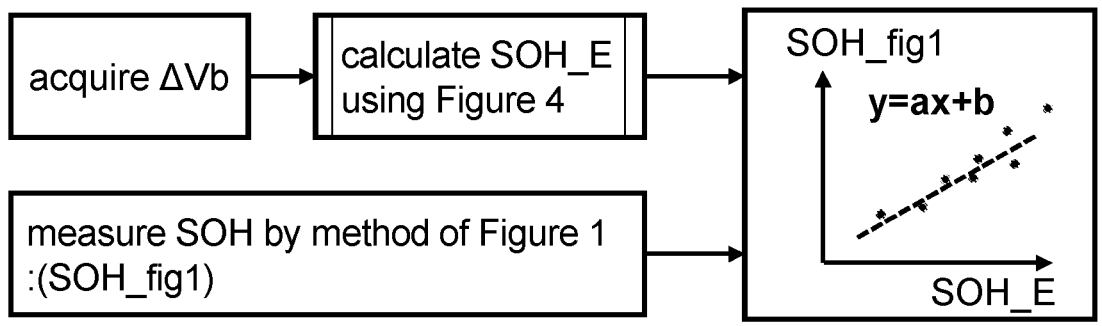
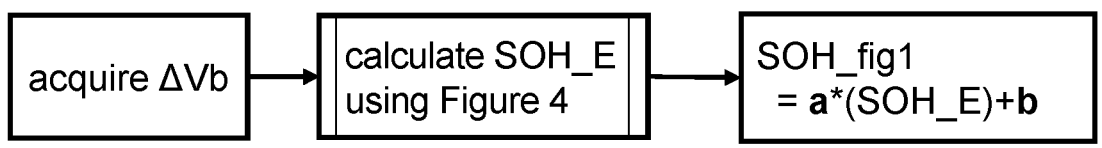
FIG. 5B
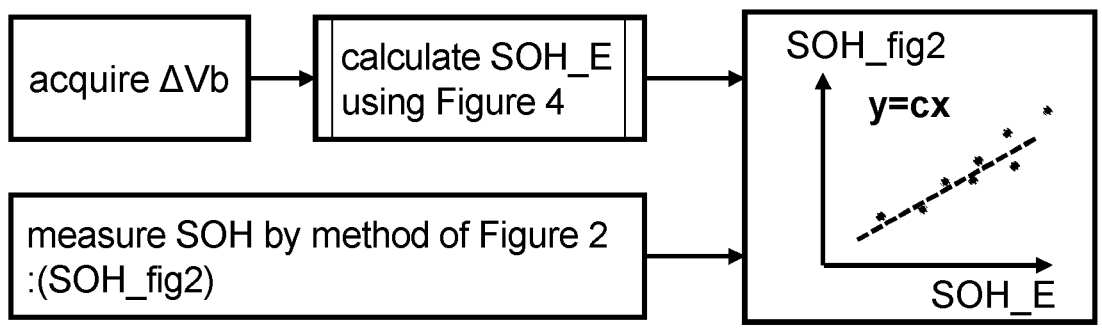
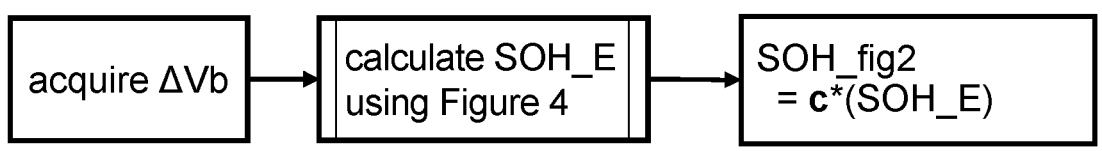

FIG. 5C
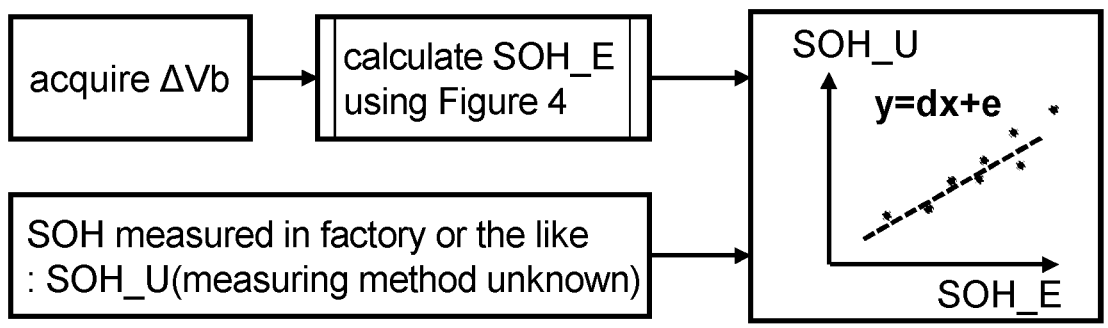
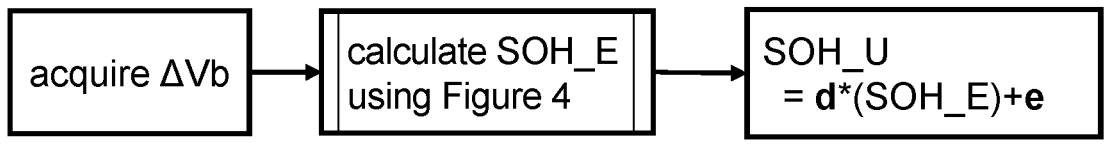

FIG. 20

| Rest after charge | | | | Rest after discharge | | | |
|---|---|---|---|---|---|---|---|
| I | c_Ri_I_1 | c_Ri_I_2 | ... | I | c_Ri_I_1 | c_Ri_I_2 | ... |
| I1 | ... | ... | ... | I1 | ... | ... | ... |
| I2 | ... | ... | ... | I2 | ... | ... | ... |
| ... | ... | ... | ... | ... | ... | ... | ... |
| Rest after charge | | | | Rest after discharge | | | |
| T(K) | c_Ri_T_1 | c_Ri_T_2 | ... | T(K) | c_Ri_T_1 | c_Ri_T_2 | ... |
| T1 | ... | ... | ... | T1 | ... | ... | ... |
| T2 | ... | ... | ... | T2 | ... | ... | ... |
| ... | ... | ... | ... | ... | ... | ... | ... |
| Rest after charge | | | | Rest after discharge | | | |
| I | c_SOH_I_1 | c_SOH_I_2 | ... | I | c_SOH_I_1 | c_SOH_I_2 | ... |
| I1 | ... | ... | ... | I1 | ... | ... | ... |
| I2 | ... | ... | ... | I2 | ... | ... | ... |
| ... | ... | ... | ... | ... | ... | ... | ... |
| Rest after charge | | | | Rest after discharge | | | |
| T(K) | c_SOH_T_1 | c_SOH_T_2 | ... | T(K) | c_SOH_T_1 | c_SOH_T_2 | ... |
| T1 | ... | ... | ... | T1 | ... | ... | ... |
| T2 | ... | ... | ... | T2 | ... | ... | ... |
| ... | ... | ... | ... | ... | ... | ... | ... |

BATTERY STATE ESTIMATION DEVICE AND POWER SYSTEM

TECHNICAL FIELD

The present disclosure relates to a technique for estimating state of battery.

BACKGROUND ART

State of Health (SOH) of battery is estimated or measured by various methods. A method for measuring SOH calculates SOH by a ratio between a predefined charge/discharge capacity and an actual charge/discharge capacity when the battery is charged or discharged up to upper limit or lower limit, respectively.

Patent Literature 1 below describes a method for estimating SOH of battery. This document describes a technical problem as: To provide a deterioration state estimation device and its deterioration state estimation method for estimating the deterioration state of a battery mounted on a power storage device with small power consumption. This document also describes a solution for the technical problem as: Discharging power from a secondary battery charged to a charge upper limit voltage, and measuring a discharge voltage within a predetermined time range after a lapse of a time in which a transient response associated with charge transfer disappears in the secondary battery after the discharge is started; The deterioration state of the battery is estimated from at least one estimated value of the residual capacity, the charge/discharge efficiency, and the plateau end point capacity by using the acquired differential voltage between the discharge voltage and the charge upper limit voltage (refer to Abstract).

CITATION LIST

Patent Literature

Patent Literature 1: JP 2016-145795 A

SUMMARY OF INVENTION

Technical Problem

When estimating or measuring SOH, for example, SOH may be calculated on the basis of capacity change from full charge to full discharge in some case. In other cases, SOH is calculated on the basis of capacity change from slightly before full charge to slightly before full discharge. When the base capacity change is not determined on which SOH is calculated, it is difficult to precisely acquire SOH. Therefore, it is desirable if SOH is acquired without depending on such calculation basis.

This disclosure is made in the light of the technical problem above. The objective of this disclosure is to provide a technique that can precisely estimate SOH without depending on calculation basis of capacity change when acquiring SOH.

Solution to Problem

A battery state estimating device according to this disclosure: identifies a first period and a second period in a rest period after a battery finishes charging or discharging; refers to a relationship between an estimated value of state of health of the battery which is acquired using a difference of output voltage in the second period and an actually measured value of the state of health, thereby estimating the actually measured value.

Advantageous Effects of Invention

With the battery state estimating device according to this disclosure, it is possible to precisely estimate SOH without depending on calculation basis of capacity change when acquiring SOH.

BRIEF DESCRIPTION OF DRAWINGS

FIG. 5A is a diagram explaining a procedure for estimating an actually measured value of SOH.

FIG. 5B is a diagram explaining another procedure for estimating an actually measured value of SOH.

FIG. 5C is a diagram explaining another procedure for estimating an actually measured value of SOH.

FIG. 20 is a diagram illustrating a configuration and a data example of a relationship table 141.

DESCRIPTION OF EMBODIMENTS

Embodiment 1

Figure 1:
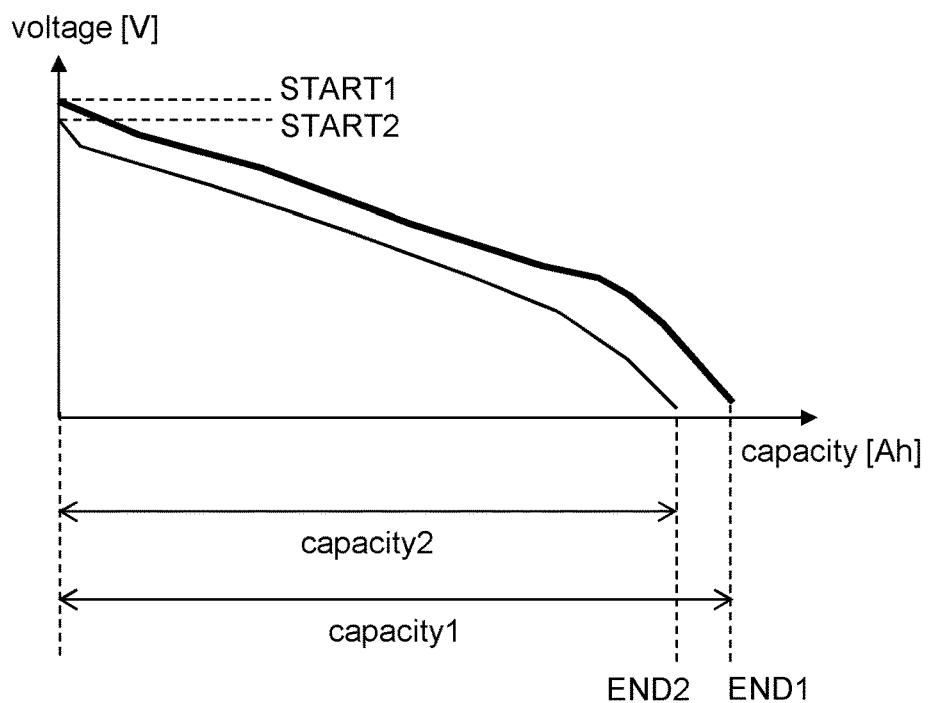
FIG. 1 is a schematic diagram illustrating a procedure for actually measuring a state of health of a battery.

FIG. 1 is a schematic diagram illustrating a procedure for actually measuring a state of health of a battery. The vertical axis indicates output voltage of the battery. The horizontal axis indicates capacity of electrical charge stored in the battery. By discharging the battery at a constant discharging current from a fully charged state, the capacity gradually decreases in proportion to the discharging duration. The duration required for discharging the battery to fully discharged state represents a chargeable capacity of the battery. Therefore, the horizontal axis of FIG. 1 corresponds to the capacity of the battery.

By actually fully discharging the battery, the chargeable capacity of the battery at that time can be measured. FIG. 1 shows examples of two actually measured values (capacity1 and capacity2). Assuming that the chargeable capacity in non-degraded state is capacity0, the ratio of actually measured capacity to the capacity0 represents a state of health at that time. For example, SOH is 95% if the actually measured chargeable capacity is 95% of a capacity that should be essentially chargeable. Therefore, SOHs corresponding to each of the measured results in FIG. 1 can be calculated as below.

$$SOH1[\%] = capacity1/capacity0 \times 100$$

$$SOH2[\%] = capacity2/capacity0 \times 100$$

Figure 2:
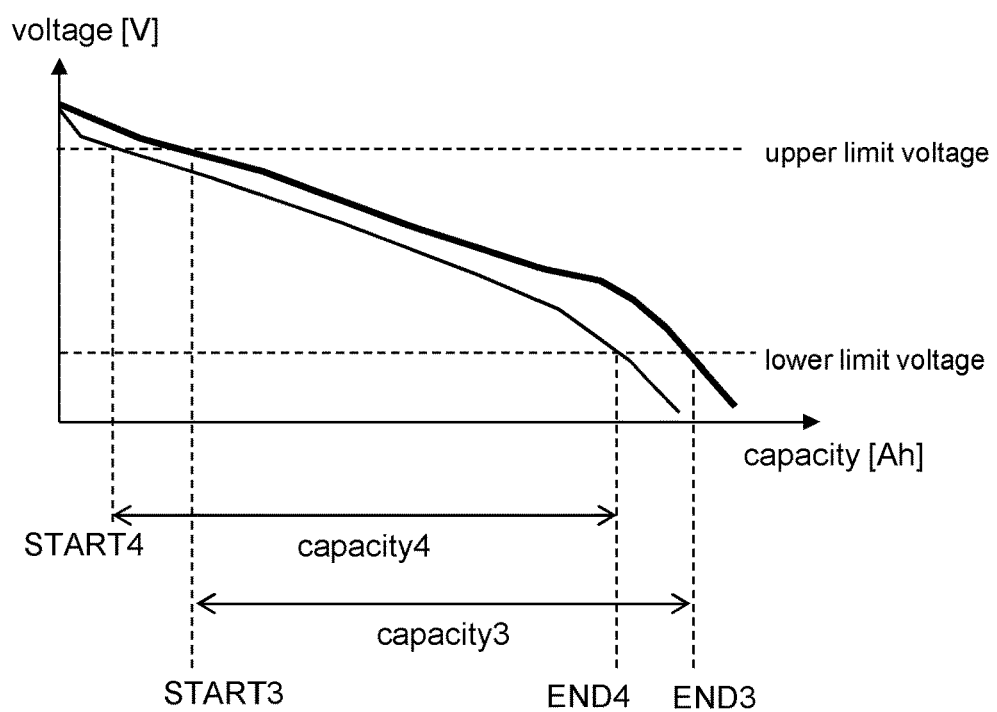
FIG. 2 is a schematic diagram illustrating another procedure for actually measuring a state of health of a battery.

FIG. 2 is a schematic diagram illustrating another procedure for actually measuring a state of health of a battery. In contrast to FIG. 1, the battery starts discharging from a state where the output voltage is slightly lower than that of fully charged state. The battery stops discharging at a state where the output voltage is slightly higher than that of fully discharged state. Other aspects are same as those in FIG. 1. Therefore, SOHs corresponding to each of the measured results in FIG. 2 can be calculated as below.

$$SOH3[\%] = capacity3/capacity0 \times 100$$

$$SOH4[\%] = capacity4/capacity0 \times 100$$

As understood by comparing FIGS. 1 and 2, the actually measured value of SOH has different numerical values depending on the definition of the start value and the end value when actually charging or discharging. If the definition of these start value and end value is not shared between related parties, it is difficult to share the precise value of SOH. Then an embodiment 1 of this disclosure provides a method for precisely acquiring SOH without depending on the definition for the start value and the end value.

Figure 3:
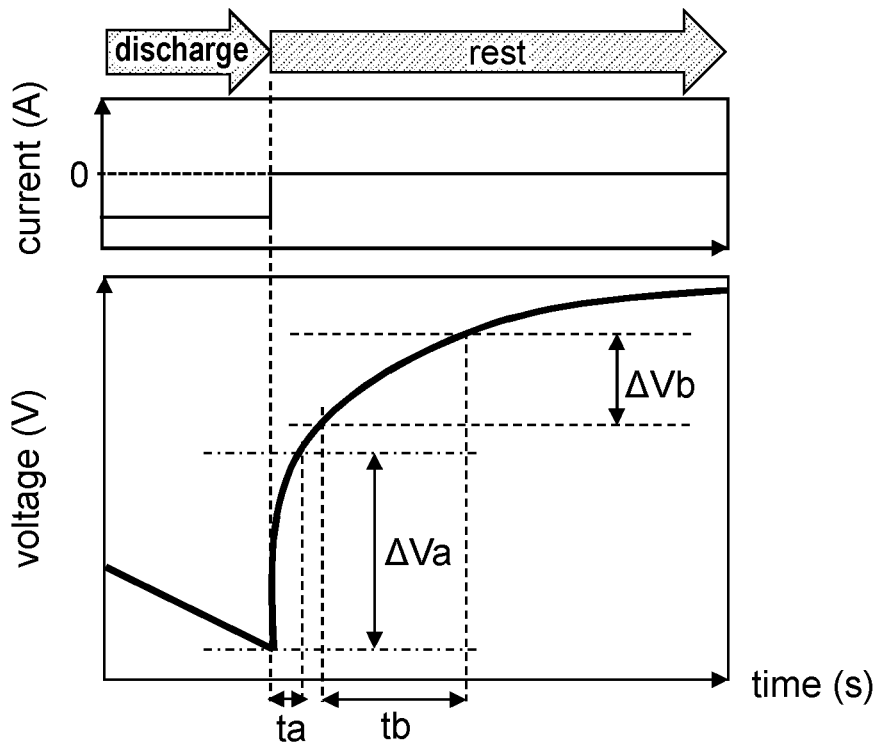
FIG. 3 is a graph illustrating a temporal change of electrical current and voltage outputted from a battery in a rest period after discharging.

FIG. 3 is a graph illustrating a temporal change of electrical current and voltage outputted from a battery in a rest period after discharging. $\Delta Va$ is an amount of change of output voltage of the battery from a first start time point at or after the end of rest period to a first time when a first duration ta has elapsed from the first start time point. $\Delta Vb$ is an amount of change of output voltage of the battery from a second start time point at or after the first time to a second time when a second duration tb has elapsed from the second start time point. The author of this disclosure has found that $\Delta Va$ is correlated to an internal resistance of the battery and that $\Delta Vb$ is correlated to SOH of the battery. The embodiment 1 utilizes this fact to estimate SOH from $\Delta Vb$. Further, it is possible to estimate the internal resistance of the battery from $\Delta Va$. Specific estimating method will be explained in an embodiment 5 described below. The embodiment 1 assumes that SOH can be estimated using $\Delta Vb$.

Figure 4:
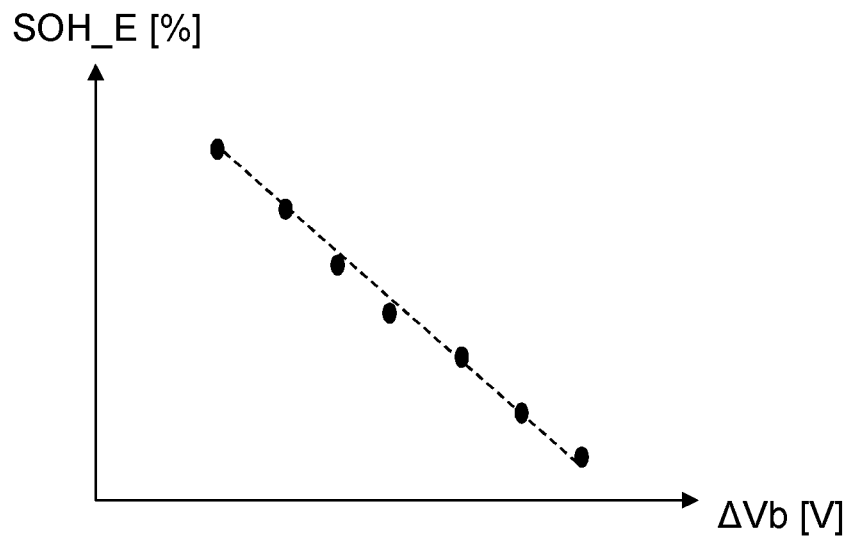
FIG. 4 is an example of relationship data describing a relationship between $\Delta Vb$ and SOH.

FIG. 4 is an example of relationship data describing a relationship between $\Delta Vb$ and SOH. This figure shows an example where the relationship between them can be represented by a first order function. However, the relationship is not limited to such example. The relationship exemplified in FIG. 4 is acquired in advance and is described in the relationship data. By applying an actually measured value of $\Delta Vb$ to the relationship data, it is possible to acquire an estimated value SOH_E of SOH.

When acquiring an actually measured value of $\Delta Vb$, it is not necessary to perform discharging operation from full charge (or upper limit output voltage) to full discharge (or lower limit output voltage). It is sufficient to measure a change in output voltage after performing discharging operation for short duration. In other words, the procedure for estimating SOH using $\Delta Vb$ can be performed within short duration. The discharge start voltage and the discharge end voltage may be any arbitrary values. Details will be described in the embodiment 5 below.

FIG. 5A is a diagram explaining a procedure for estimating an actually measured value of SOH. In the light of technical problem explained in FIGS. 1-2, the embodiment 1 estimates a current actually measured value of SOH using past actually measured values of SOH instead of actually measuring SOH. This method is separated into a learning process and an applying process.

The learning process is a process for learning a relationship between SOH_E estimated by using $\Delta Vb$ and an actually measured SOH (referred to as SOH_fig1). An actually measured value of $\Delta Vb$ in a rest period after discharging the battery is acquired. By applying $\Delta Vb$ to the relationship of FIG. 4, SOH_E is calculated. On the other hand, SOH_fig1 is actually measured for the same battery by the procedure described in FIG. 1. The relationship between them is plotted on a two dimensional graph. Accordingly, it is possible to acquire one measured point as shown in the right top graph in FIG. 5A. When the degradation of battery proceeds, by performing a procedure similar to that of, it is possible to acquire other measured points similarly. For example, by proceeding degradation of the battery using accelerated test, it is possible to shrink the duration required for acquiring measured points.

According to the procedure above, in the learning process, it is possible to acquire a plot representing a relationship between SOH_E and SOH_fig1. By calculating a function that approximates this relationship, it is possible to acquire a function that represents the relationship between them. An example is shown where the relationship is approximated by a first order function. However, the function is not limited to such example.

In the applying process, an actually measured value of $\Delta Vb$ is acquired again. By applying $\Delta Vb$ to the relationship of FIG. 4, SOH_E is calculated. By applying the calculated SOH_E to the function representing the relationship between SOH_E and SOH_fig1 acquired in the learning process, it is possible to calculate SOH_fig1. Accordingly, it is possible to estimate SOH without actually measuring SOH.

FIG. 5B is a diagram explaining another procedure for estimating an actually measured value of SOH. The learning process is same as FIG. 5A except that the actually measured value of SOH is actually measured according to FIG. 2. The actually measured value of SOH is referred to as SOH_fig2. The process for actually measuring SOH is different from that of FIG. 5A. Thus the function representing the relationship between SOH_E and SOH_fig2 may be different from that of FIG. 5A. The subsequent procedure is same as in FIG. 5A.

FIG. 5C is a diagram explaining another procedure for estimating an actually measured value of SOH. FIGS. 5A and 5B explain that the actually measured value of SOH is actually measured in the learning process. On the other hand, an actual sample of battery and information which describes an actually measured result of SOH of the battery may be transferred from a shipping factory of the battery, for example. FIG. 5C shows a procedure in such cases. It is not necessary in FIG. 5C to actually measure SOH in the learning process. However, it is necessary to associate SOH with ΔVb for a same battery sample.

In the learning process, ΔVb is acquired for each of batteries, and SOH_E is calculated using the acquired ΔVb. An actually measured value of SOH of the battery sample (referred to as SOH_U) has already been acquired in the form of the information. Thus it is possible to associate SOH_E with SOH_U for that battery. The relationship between them is plotted on a two dimensional graph. Accordingly, it is possible to acquire one measured point shown in the right top graph in FIG. 5C. The relationship between SOH_E and SOH_U is similarly plotted for other battery samples. If SOHs of each battery sample are different from each other, it is possible to acquire the right top graph in FIG. 5C without performing accelerated test. The subsequent procedure is same as in FIG. 5A.

Embodiment 1. Summary

In the embodiment 1: a first period ta and a second period tb in the rest period after discharging are identified; an estimated value SOH_E of SOH is acquired using a difference ΔVb of output voltage in the second period tb, and an actually measured value of SOH is acquired, thereby acquiring the relationship between them. SOH_E is newly calculated using an actually measured value of ΔVb, and then an actually measured value of SOH is estimated using the newly calculated SOH_E. When estimating an actually measured value of SOH, it is sufficient to acquire an actually measured value of ΔVb again. Thus there is no influence due to the difference of actually measuring procedure as between FIGS. 1-2. Accordingly, it is possible to precisely estimate an actually measured value of SOH without depending on the actually measuring procedure for SOH.

Embodiment 2

An assembled battery formed by a plurality of battery cells sometimes performs balance control for balancing behaviors between battery cells. For example, passive balance control is a process for aligning to a battery cell that has a smallest SOC (State of Charge), by discharging battery cells that have large SOC via resistors. A similar process is performed when aligning to a battery cell that is degraded most. In an embodiment 2 of this disclosure, a method is described that estimates an actually measured value of SOH for an assembled battery performing passive balance control.

Figure 6:
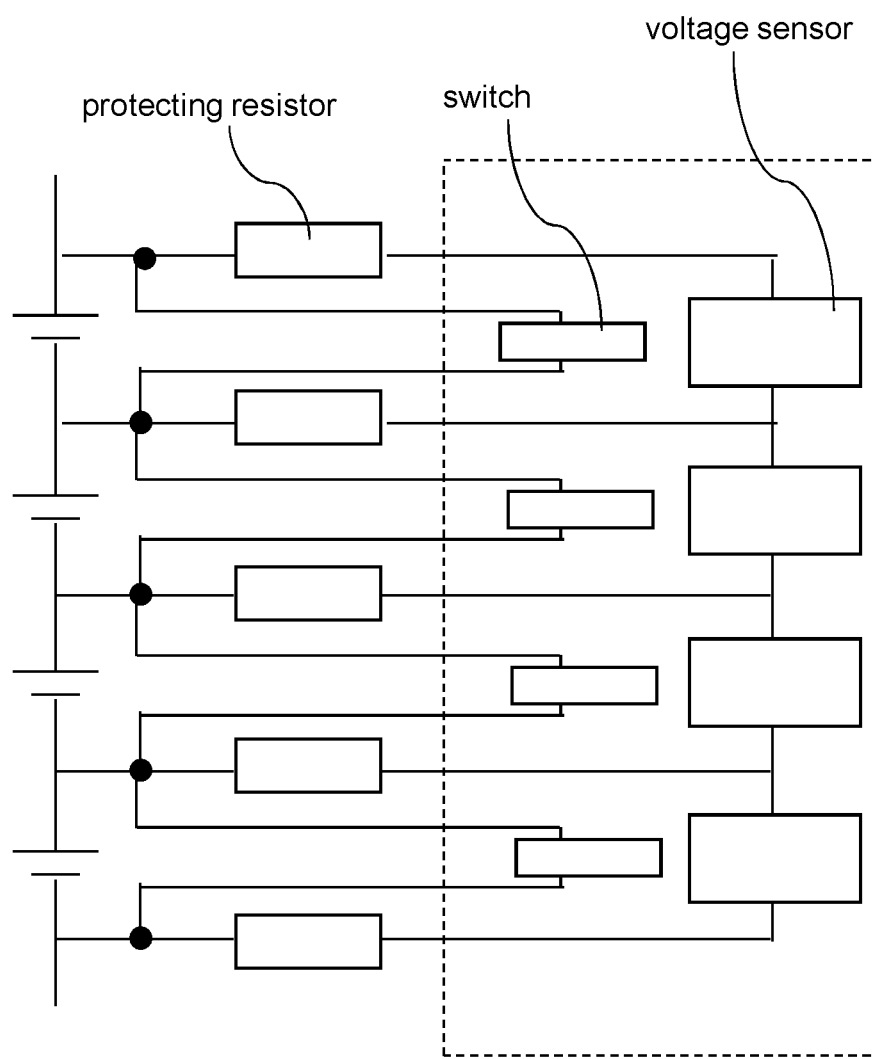
FIG. 6 is a circuit diagram of an assembled battery that performs passive balance control.

FIG. 6 is a circuit diagram of an assembled battery that performs passive balance control. This circuit diagram is an example. Other circuit configuration may be employed as long as it is possible to perform passive balance control. Hereinafter, it is assumed that an actually measured value of SOH is estimated for the assembled battery as exemplified in FIG. 6.

Figure 7:
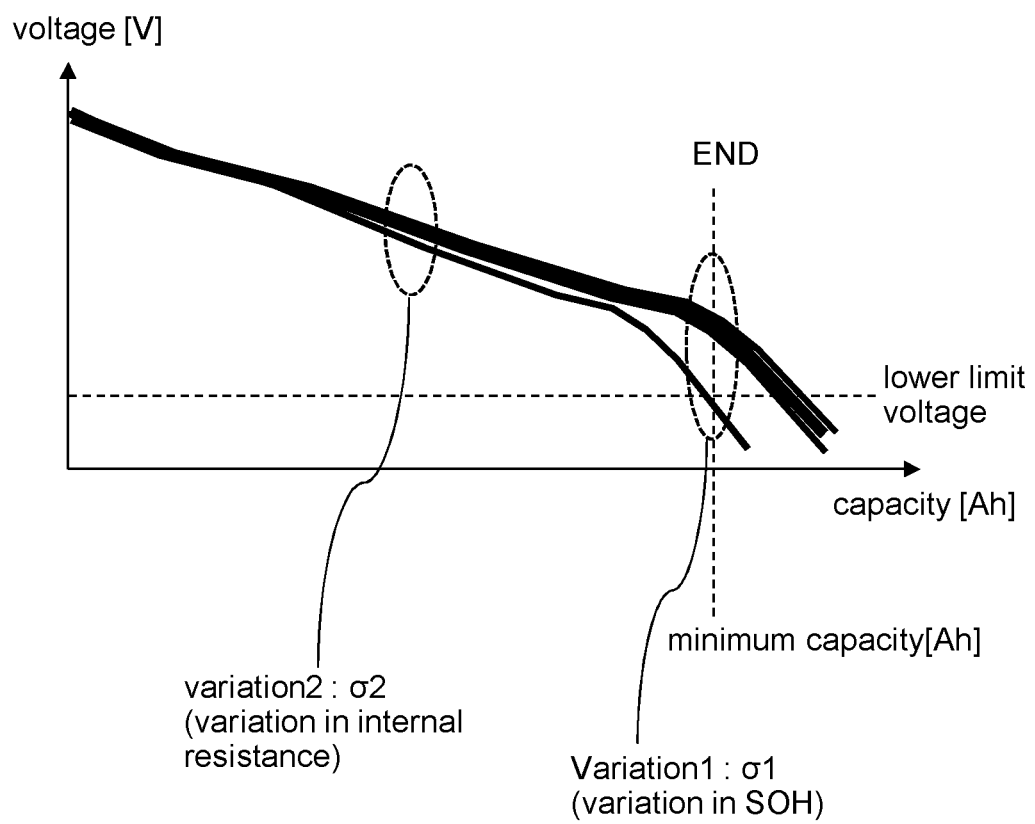
FIG. 7 is a graph exemplifying a temporal change of output voltage from each battery cell when performing passive balance control.

FIG. 7 is a graph exemplifying a temporal change of output voltage from each battery cell when performing passive balance control. A battery cell that is degraded most reaches the fully discharged state (or lower limit voltage) first. The discharge operation of the assembled battery ends at this time point. Then although the assembled battery still can continue discharging, the discharge operation is forced to stop. Thus it may not be possible to precisely estimate the actually measured value of SOH using the method in the embodiment 1. Then the embodiment 2 provides a method of estimating SOH for the whole of assembled battery considering variations σ1 and σ2 of output voltage for each of battery cells shown in FIG. 7.

σ1 is a variation of output voltage that is caused due to variation in SOH for each battery cell. The variation between battery cells is significant at the end of discharge. σ2 is a variation of output voltage that is caused due to variation in internal resistance for each battery cell. σ2 is caused during discharging. The result of estimating the actually measured value of SOH is also influenced by those variations. The embodiment 2 corrects the result of estimating the actually measured value of SOH by a correcting coefficient that is calculated based on these variations. σ1 and σ2 are variations of output voltage. Thus they can be handled as standard deviations of output voltage for each battery cell.

Figure 8:
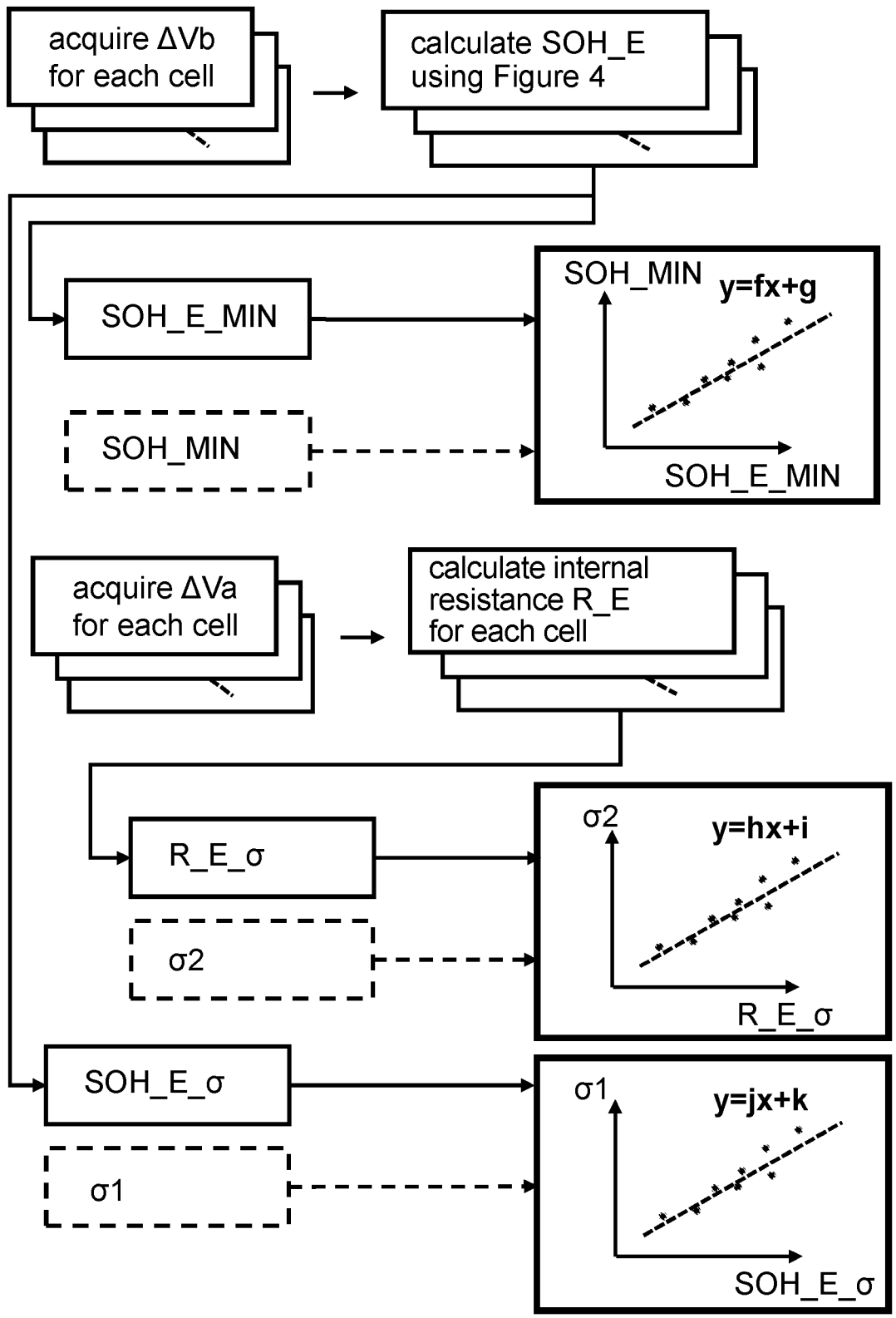
FIG. 8 is a diagram explaining a learning process in an embodiment 2.

FIG. 8 is a diagram explaining a learning process in the embodiment 2. In the learning process, the relationship between an estimated value of SOH using ΔVb (referred to as SOH_E_MIN) and an actually measured value of SOH (referred to as SOH_IN) is acquired as in the embodiment 1, for a battery cell that is degraded most. This relationship is shown in the graph first from top in FIG. 8. Accordingly, it is possible to estimate an actually measured value of SOH for the battery cell that is degraded most. The battery cell degraded most has a largest one of ΔVb. Thus SOH_E of the battery cell having the largest ΔVb can be referred to as SOH_E_MIN.

SOHs of each battery cell in FIG. 7 can be estimated similarly to the embodiment 1 using ΔVb of each battery cell. Since SOH_E of each battery cell is varied, a value representing such variation (e.g. standard deviation SOH_E_σ) can be calculated. On the other hand, variation σ1 of output voltage due to variation in SOH can be actually measured by performing actual discharging operation. By acquiring a relationship between them at each time the battery degrades, it is possible to acquire the relationship shown in the graph third from top in FIG. 8.

The author of this disclosure has found that ΔVa in FIG. 2 correlates to internal resistance of battery. Therefore, by acquiring an actually measured value of ΔVa, it is possible to calculate an estimated value R_E of internal resistance of each battery cell. The estimating procedure will be described in the embodiment 5 below. Since the internal resistances of each battery cell are varied, a value that represents the variation (e.g. standard deviation R_E_σ) can be calculated. On the other hand, variation σ2 of output voltage due to variation in internal resistance can be actually measured by performing actual discharging operation. By acquiring a relationship between them as the battery degrades, it is possible to acquire the relationship shown in the graph second from top in FIG. 8.

Figure 9:
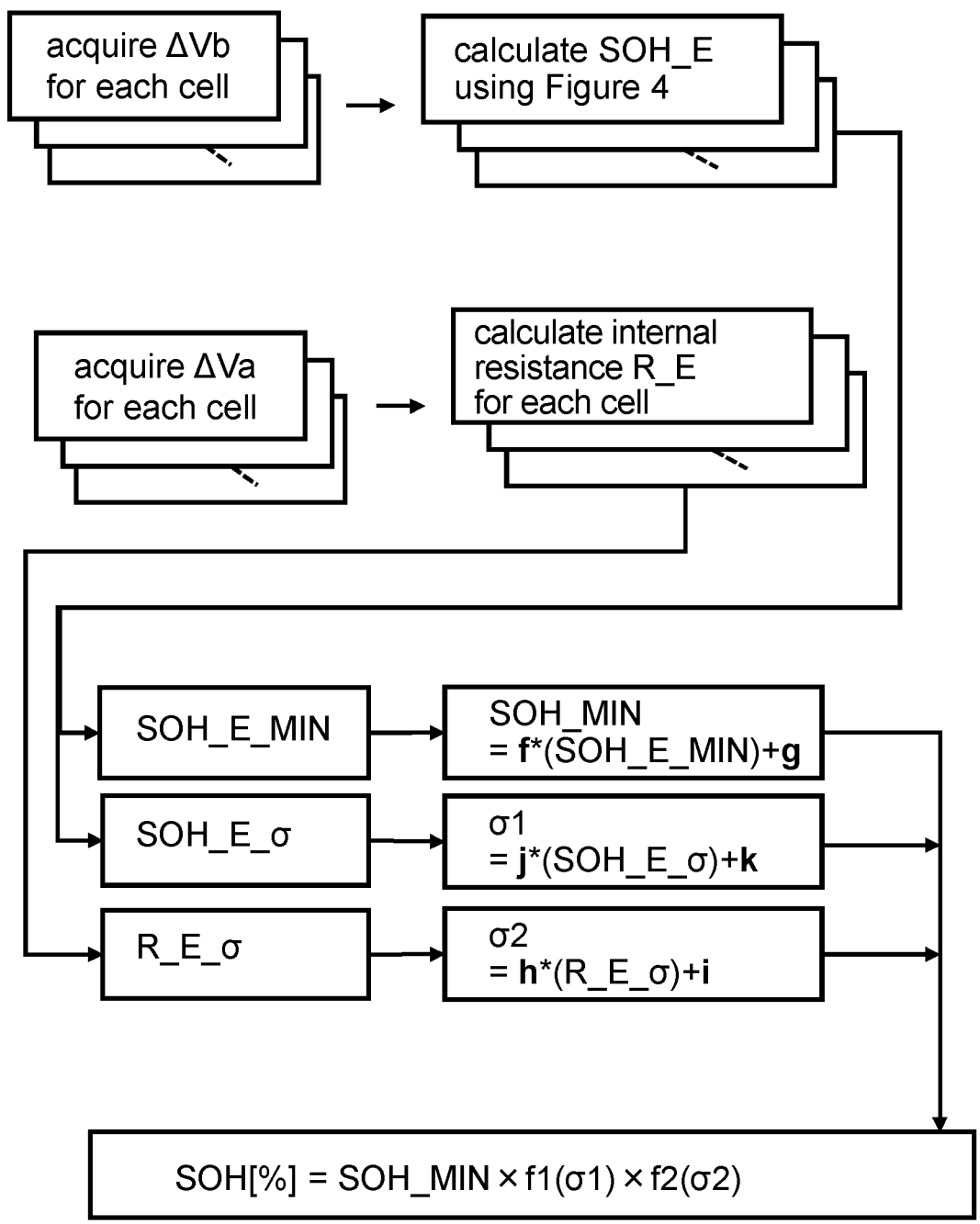
FIG. 9 is a diagram explaining an applying process in the embodiment 2.

FIG. 9 is a diagram explaining an applying process in the embodiment 2. ΔVb is acquired for each battery cell forming the assembled battery to calculate SOH_E of each battery cell. SOH_E of a battery cell having a largest ΔVb is used as SOH_E_MIN. By applying SOHE_MIN to the relationship shown in the graph first from top in FIG. 8, it is possible to estimate an actually measured value of SOH_MIN. By applying a standard deviation SOH_E_σ of SOH_E to the relationship shown in the graph third from top in FIG. 8, it is possible to estimate σ1. Further, ΔVa is acquired for each battery cell to calculate R_E of each battery cell. By applying a standard deviation R_E_σ of R_E to the relationship shown in the graph second from top in FIG. 8, it is possible to estimate σ2.

SOH_MIN is an estimated value of actually measured value of SOH of a battery cell that is degraded most. SOH of assembled battery is assumed to be larger than SOH_MIN. Thus by correcting SOH_MIN upwardly, it is possible to estimate SOH of assembled battery. This upward correcting amount can be defined by a function f1(σ1) of σ1 and a function f2(σ2) of σ2. Specific details of each of those functions can be experimentally acquired in advance, for example. Each of those functions may be configured as coefficients that are multiplied to SOH_MIN. Alternatively, each of those functions may be configured as other arbitrary correcting amounts. FIG. 9 shows a calculation example where those functions are configured as multiplying coefficients.

Embodiment 2. Summary

In the embodiment 2, SOH of each battery cell forming an assembled battery that performs passive balance control is estimated by ΔVb of each battery cell. By correcting state of health of a battery cell that is degraded most (SOH_MIN) upwardly, an actually measured value of SOH of the assembled battery is estimated. Accordingly, it is possible to estimate the actually measured value of SOH for the assembled battery performing passive balance control, as in the embodiment 1.

In the embodiment 2, SOH_E is calculated for each battery cell forming the assembled battery, and a standard deviation SOH_E_σ of SOH_E is also calculated. A relationship between SOH_E_σ and σ1 is acquired in advance. By referring to the relationship using a newly calculated SOH_E_σ, it is possible to estimate an actually measured value of σ1 similarly to estimating SOH. Accordingly, it is possible to estimate an actually measured value of SOH_MIN, and to estimate its upward correcting amount. An internal resistance R_E of battery cell and σ2 due to R_E can also be estimated similarly.

Embodiment 3

Active balance control may be used for performing balance control of assembled battery. Active balance control is a method that redistributes energy of a battery cell having large SOC into battery cells having small SOC. An embodiment 3 of this disclosure describes a method for estimating SOH for an assembled battery that performs active balance control.

Figure 10:
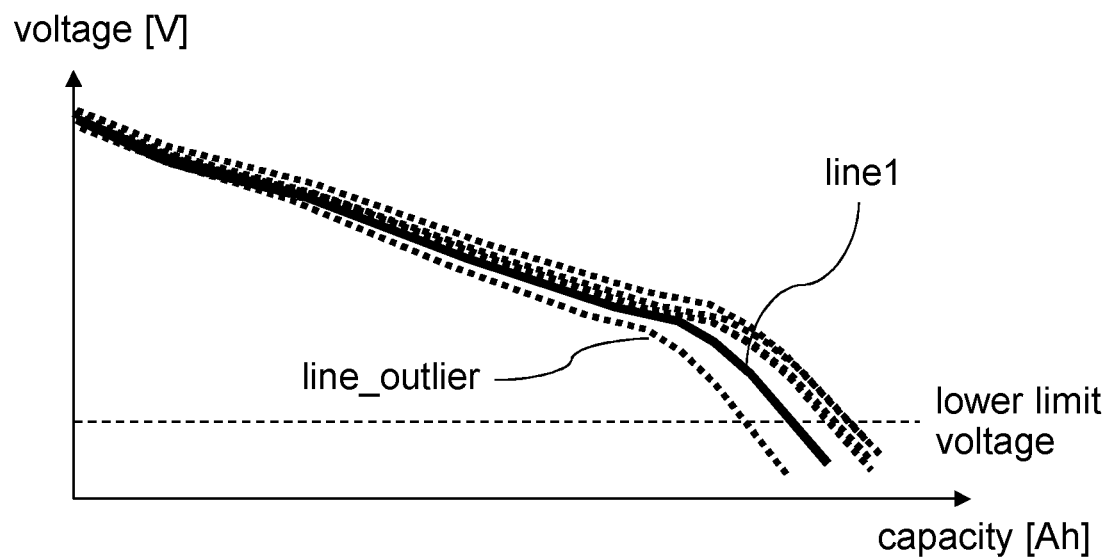
FIG. 10 is a graph exemplifying a temporal change of output voltage from each battery cell when performing active balance control.

FIG. 10 is a graph exemplifying a temporal change of output voltage from each battery cell when performing active balance control. Active balance control smooths capacities of each battery. Thus the temporal variation of output voltage converges to an average of each battery cell (line1 in FIG. 10). Therefore, when estimating SOH or internal resistance of the assembled battery, it is typically assumed to use the average of each battery cell.

However, if there exists an outlier battery cell, the average value is dragged by the outlier cell. Thus when estimating SOH or internal resistance of the assembled battery, the estimated value is influenced by the outlier cell. Thus the embodiment 3 describes a procedure for estimating SOH or internal resistance of the assembled battery after removing the influence from the outlier cell.

Figure 11:
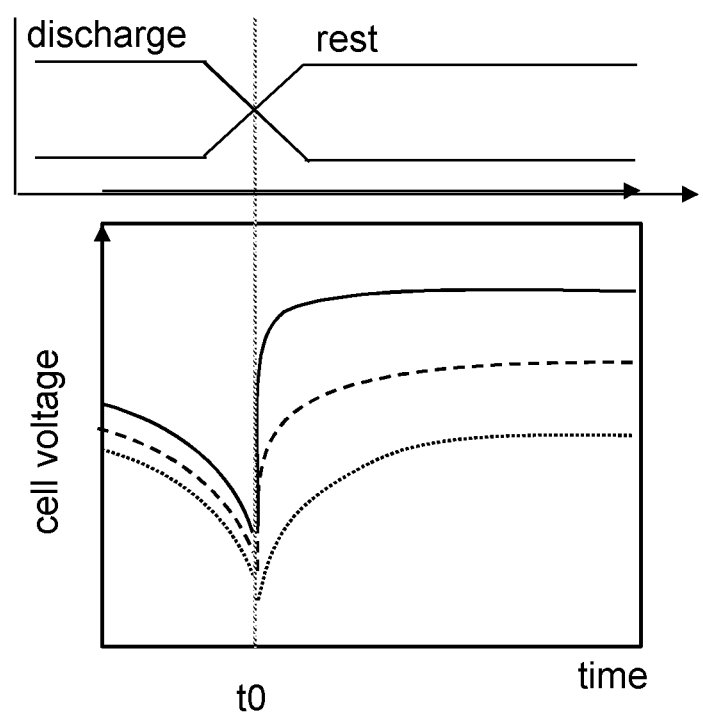
FIG. 11 is a graph exemplifying a variation of output voltage for each battery cell in a rest period after discharging operation.

FIG. 11 is a graph exemplifying a variation of output voltage for each battery cell in a rest period after discharging operation. By performing active balance control, the output voltages from each battery cell converge to an average value. However, the balance control has not finished yet immediately after entering the rest period. Thus it is possible to clearly identify the variation for each cell. Therefore, as in the embodiments 1-2, it is possible to estimate SOH of each cell using ΔVb, and to estimate internal resistance of each cell using ΔVa.

Figure 12:
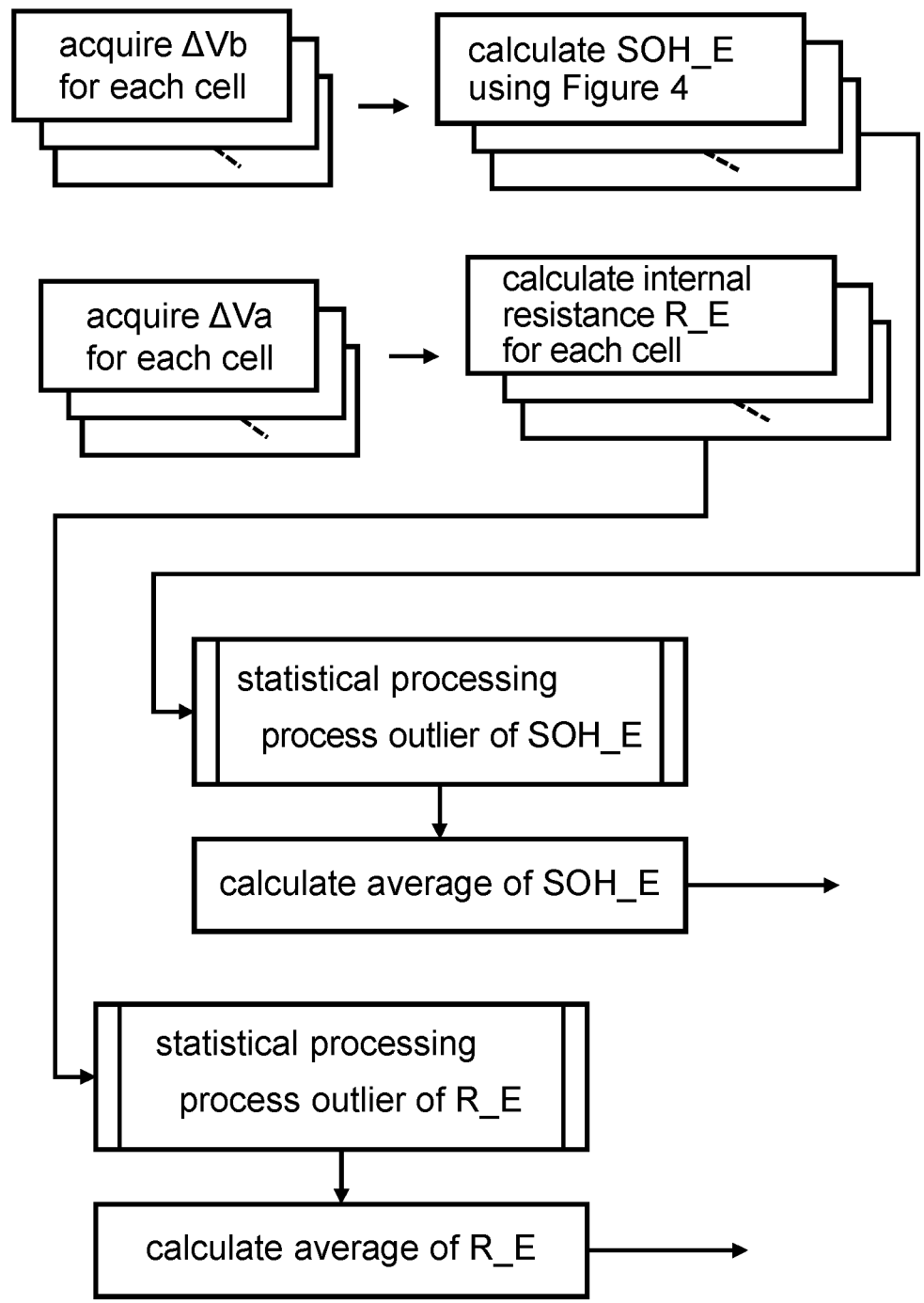
FIG. 12 is a diagram explaining a procedure for estimating SOH and internal resistance of an assembled battery in an embodiment 3.

FIG. 12 is a diagram explaining a procedure for estimating SOH and internal resistance of an assembled battery in the embodiment 3. As in the embodiment 1, SOH_E is calculated using ΔVb of each battery cell. After removing outliers by statistically processing the calculated SOH_E, an average of SOH_E is calculated. This average value can be deemed as SOH of the assembled battery. Further, as in the embodiment 2, R_E is calculated using ΔVa of each battery cell. After removing outliers by statistically processing the calculated R_E, an average of R_E is calculated. This average value can be deemed as an internal resistance of the assembled battery.

Embodiment 4

An embodiment 4 of this disclosure describes a configuration example of a battery state estimating device that implements methods for estimating SOH (or internal resistance, same in below) of battery explained in the embodiments 1-3.

Figure 13:
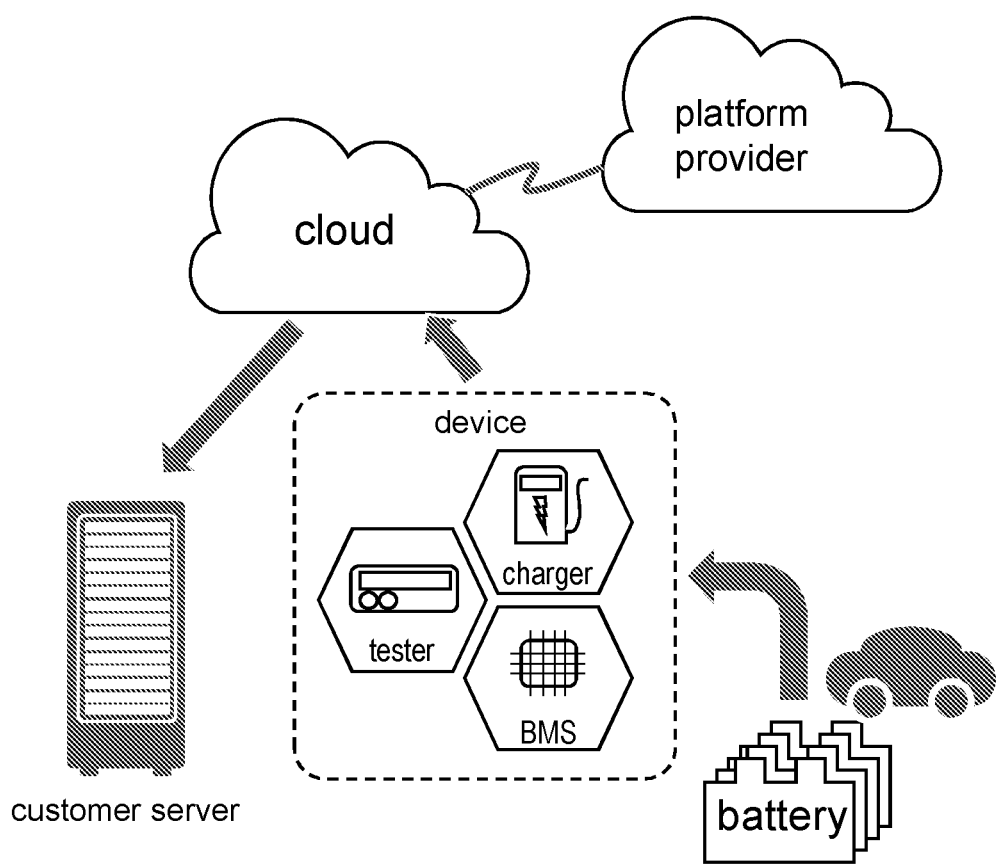
FIG. 13 is a schematic diagram exemplifying an application of the battery state estimating device according to an embodiment 4.

FIG. 13 is a schematic diagram exemplifying an application of the battery state estimating device according to the embodiment 4. The battery management device estimates SOH of battery according to the procedures explained in the embodiments 1-3. The battery (e.g. battery cell, battery module, battery pack, etc.) which needs charge or discharge may be connected to various devices, such as a tester, a BMS (battery management system), a battery charger, and so on. When the battery is connected to these devices, the battery is in any one of charge operation/discharge operation/dormant state. Depending on the place where the algorithm for estimating SOH is performed, SOH may be calculated on the devices above or on a computer that is connected via a network such as on a cloud server. The benefit to calculate on a device to which the battery is connected is that the battery state (voltage outputted from battery, electric current outputted from battery, battery temperature, etc.) can be acquired highly frequently.

The SOH calculated on a cloud system may be sent to a computer owned by a user. The user computer may provide this data to a specific application such as inventory management. The SOH calculated on the cloud system may be stored in a database of a cloud platform provider, for use in another application. Such another application may include optimization of exchange route of electric vehicle, energy management, and so on.

Figure 14:
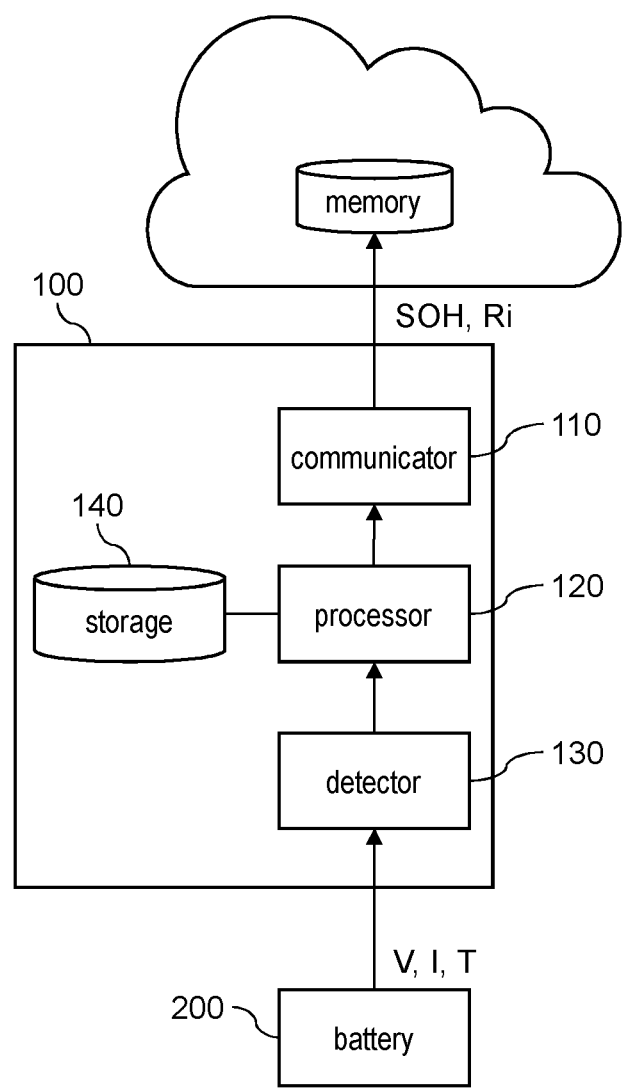
FIG. 14 is a diagram illustrating a configuration example of the battery state estimating device 100 according to the embodiment 4.

FIG. 14 is a diagram illustrating a configuration example of the battery state estimating device 100 according to the embodiment 4. The battery management device 100 in FIG. 14 is connected to a battery 200. The battery management device 100 is a device that receives electric power from the battery 200. The battery management device 100 corresponds to the tester in FIG. 8. The battery management device 100 includes a communicator 110, a processor 120, a detector 130, and a storage unit 140.

The detector 130 acquires a detected value V of voltage outputted from the battery 200, and a detected value I of electrical current outputted from the battery 200. Optionally, the detector 130 may acquire a detected value T of temperature of the battery 200. These detected values may be detected by the battery 200 itself and be notified to the detector 130. Alternatively, these detected values may be detected by the detector 130. Details of the detector 130 will be described later.

The processor 120 estimates SOH of the battery 200, using the detected values acquired by the detector 130. The estimating procedure is as explained in the embodiments 1-3. The communicator 110 sends, to outside of the battery management device 100, the SOH estimated by the processor 120. For example, they may be sent to a memory included in the cloud system. The storage unit 140 stores the relationship data explained in the embodiments 1-3.

The processor 120 may be configured by hardware such as circuit device implementing the functionality of the processor 120. Alternatively, the processor 120 may be configured by software implementing the functionality of the processor 120 and by processing devices such as CPU (Central Processing Unit) executing the software.

Figure 15:
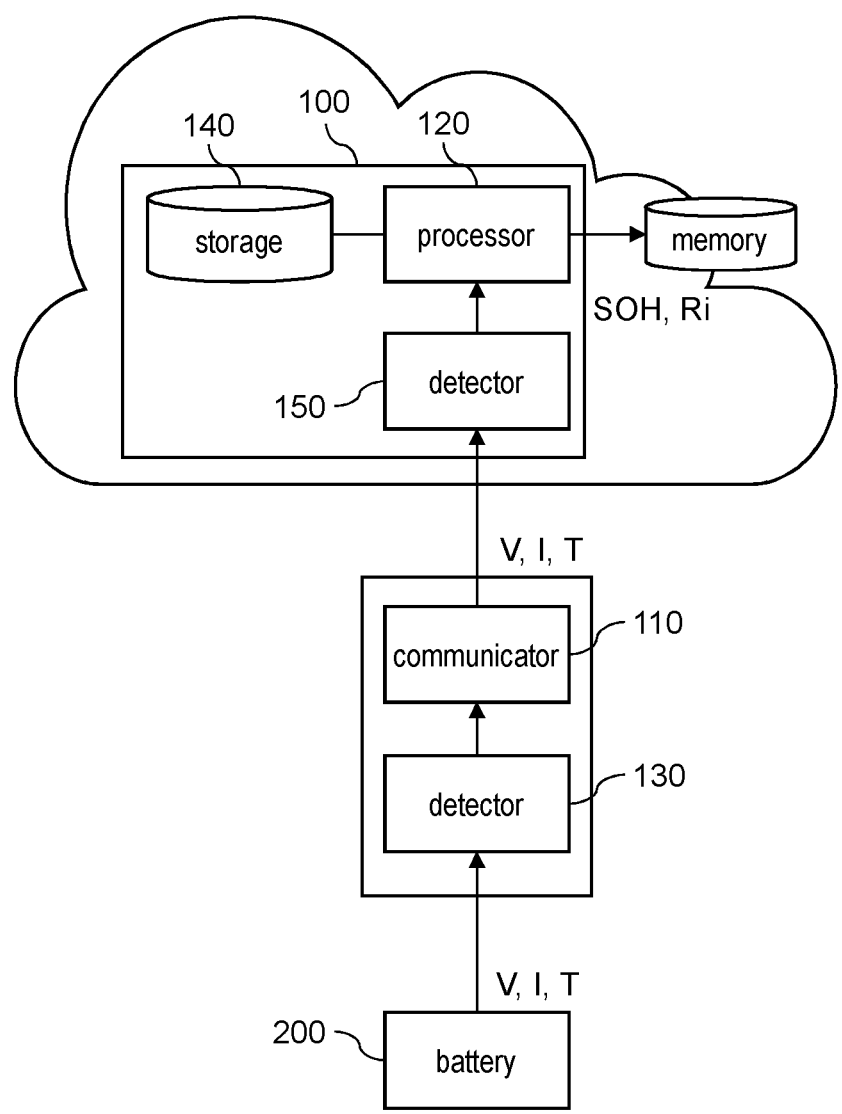
FIG. 15 is a diagram illustrating another configuration example of the battery state estimating device 100.

FIG. 15 is a diagram illustrating another configuration example of the battery state estimating device 100. The battery state estimating device 100 is not necessarily a device that receives electric power by directly connecting to the battery 200. FIG. 15 illustrates a form where the battery state estimating device 100 does not include the communicator 110 and the detector 130 described in FIG. 14. The battery state estimating device 100 in FIG. 15 acquires the voltage V, the electrical current I, and the temperature T of the battery 200 from the communicator 110. Specifically, the detector 150 included in the battery state estimating device 100 receives these detected values via a network. Then the processor 120 calculates SOH using these detected values.

Figure 16:
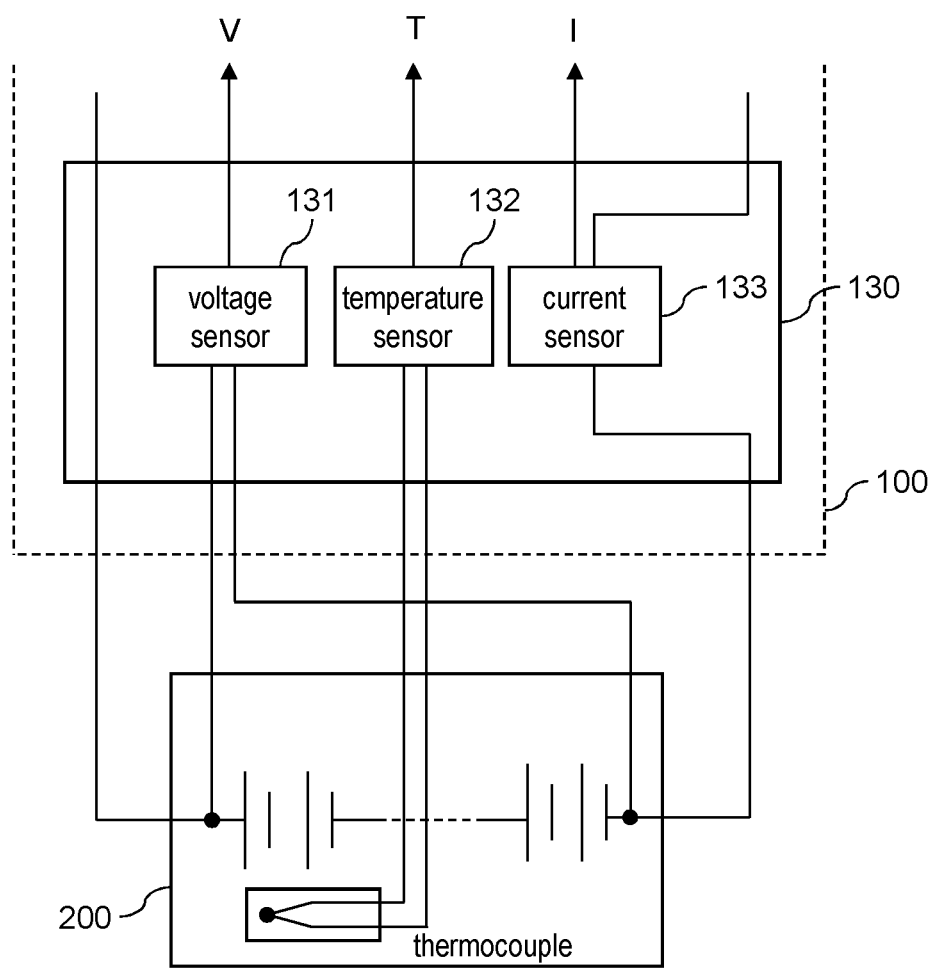
FIG. 16 illustrates a configuration example where a detector 130 is connected to a battery 200.

FIG. 16 illustrates a configuration example where a detector 130 is connected to the battery 200. The detector 130 may be configured as a part of the battery state estimating device 100, or may be configured as another module separated from the battery state estimating device 100. The detector 130 includes a voltage sensor 131, a temperature sensor 132, and a current sensor 133 for acquiring the voltage V, the temperature T, and the current I when charging or discharging the battery 200.

The voltage sensor 131 measures a voltage across terminals (output voltage from the battery 200) of the battery 200. The temperature sensor 132 is connected to a thermocouple included in the battery 200, for example, and measures the temperature of the battery 200 via the thermocouple. The current sensor 133 is connected to a terminal of the battery 200, and measures the electrical current outputted from the battery 200. The temperature sensor 132 is optional, and is not necessarily included in the configuration.

Embodiment 5

An embodiment 5 of this disclosure describes a specific method for estimating SOH using ΔVb, and a specific method for estimating internal resistance using ΔVa, respectively. The configuration of the battery state estimating device 100 is same as in the embodiment 4. The procedure after estimating SOH and internal resistance is same as in the embodiments 1-3.

Figure 17:
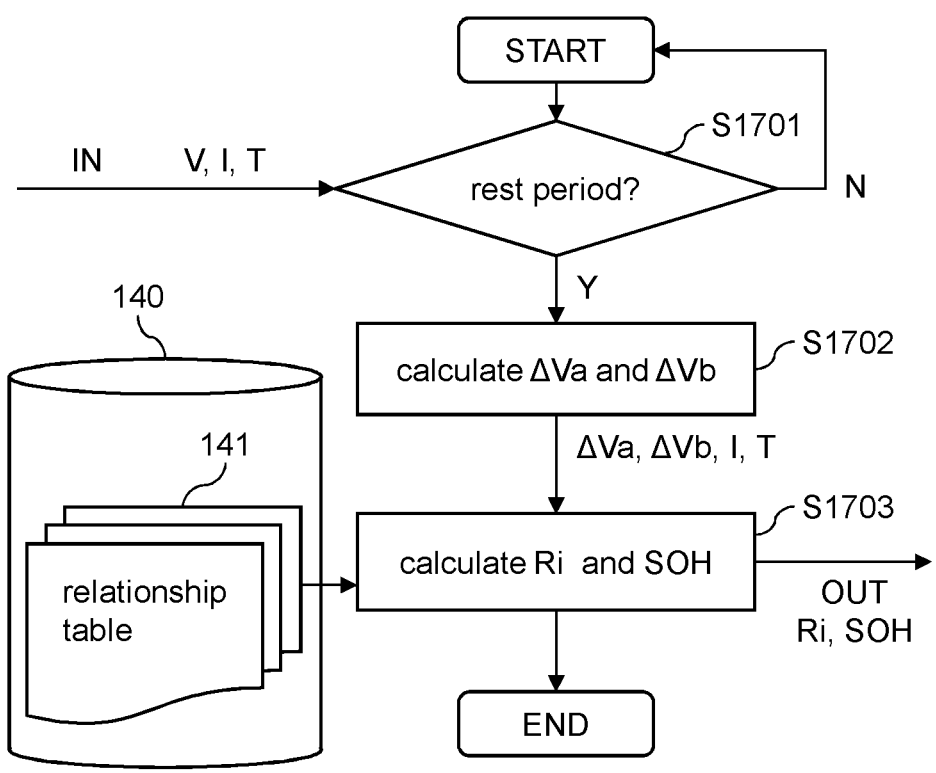
FIG. 17 is a flowchart explaining a procedure for a processor 120 to calculate SOH.

FIG. 17 is a flowchart explaining a procedure for the processor 120 to calculate SOH. The processor 120 starts this flowchart at appropriate timing, such as when instructed to start this flowchart, at each of predetermined interval, and so on. Hereinafter, each step in FIG. 17 will be described.

(FIG. 17: Step S1701)

The processor 120 determines whether it is a rest period after charging or a rest period after discharging. If it is not the rest period now, this flowchart terminates. If it is the rest period, the flowchart proceeds to S1702. It can be determined whether it is the rest period after discharging, by such as (a) the output current from the battery 200 varies from a negative value (I<0) to zero; (b) the output current varies from a negative value to a value around zero and is stable ({I}<threshold).

(FIG. 17: Step S1702)

The processor 120 calculates ΔVa and ΔVb. ΔVa is a varied amount of output voltage of the battery 200, from a first start time point at or after the rest period ends to a first time when a first duration ta has elapsed from the first start time point. ΔVb is a varied amount of output voltage of the battery 200 from a second start time point at or after the first time to a second time when a second duration tb has elapsed from the second start time point. The procedure for calculating those values will be described later.

(FIG. 17: Step S1703)

The processor 120 calculates an internal resistance Ri and SOH of the battery 200 according to the equations 1 and 2 below. $f_{Ri}$ defines Ri as a function of ΔVa. $f_{Ri}$ has a parameter (c_Ri_T) that varies with the temperature of the battery 200 and a parameter (c_Ri_I) that varies with the output current of the battery 200. $f_{SOH}$ defines SOH as a function of ΔVb. $f_{SOH}$ has a parameter (c_SOH_T) that varies with the temperature of the battery 200 and a parameter (c_SOH_I) that varies with the output current of the battery 200. These parameters are defined by a relationship table 141 stored in the storage unit 140. A specific example of each function and a specific example of the relationship table 141 will be described later. $f_{Ri}$ and $f_{SOH}$ are equations that are formed based on experimental data for each lot, for example.

(FIG. 17: step S1073: equations)

$$Ri = f_{Ri}(\Delta Va, c\_Ri\_R\_1, c\_Ri\_T\_2, \ldots, c\_Ri\_I\_1, c\_Ri\_I\_2, \ldots) \quad (1)$$

$$SOH = f_{SOH}(\Delta Vb, c\_SOH\_T\_1, \qquad\qquad\qquad\qquad (2)$$

$$c\_SOH\_T\_2, \ldots, c\_SOH\_I\_1, c\_SOH\_I\_2, \ldots)$$

Figure 18:
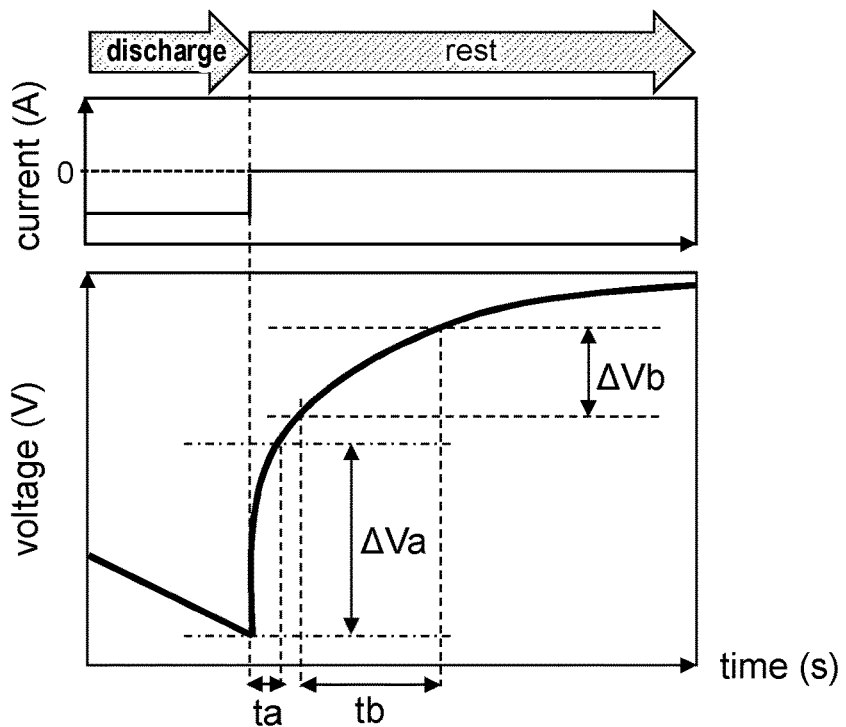
FIG. 18 is a graph illustrating a temporal variation of electrical current and voltage outputted from the battery 200 in a rest period after discharging.

FIG. 18 is a graph illustrating a temporal variation of electrical current and voltage outputted from the battery 200 in a rest period after discharging. ΔVa in S1702 is a varied amount of output voltage of the battery 200 from a first start time point at or after the end of discharge to a first time when a first duration ta has elapsed from the first start time point. The author of this disclosure has found that the output voltage immediately after the end of discharge well represents the voltage change due to the internal resistance of the battery 200. In other words, the variation (ΔVa) of output voltage in this period is strongly correlated to Ri. This embodiment utilizes such fact to estimate Ri by ΔVa. The respective optimal values of start time of ta and time length of ta can be acquired based on a section from at or after the end time of discharge to a maximum point of inclination change rate in the temporal variation curve of voltage. The section may be appropriately identified such as around both ends of the section or including both ends, depending on type of battery, device, or accuracy.

The start time of ta is not necessarily same as the discharge end time. However, it is desirable that the start time of ta is close to the discharge end time. The start time of tb is not necessarily same as the end time of ta. In both cases, ta<tb. Regarding the magnitudes of ΔVa and ΔVb, ΔVa may be larger in some case, and ΔVb may be larger in another case. Although it is assumed that ta<tb in this embodiment, the relationship could be ta>tb or ta=tb, depending on type of battery, device, or accuracy. Thus the relationship could be appropriately configured.

The author of this disclosure has found from experimental results that Ri and SOH can be precisely estimated even if the sum of ta and tb is several seconds, for example. Therefore, this embodiment can quickly estimate both Ri and SOH in the rest period.

Figure 19:
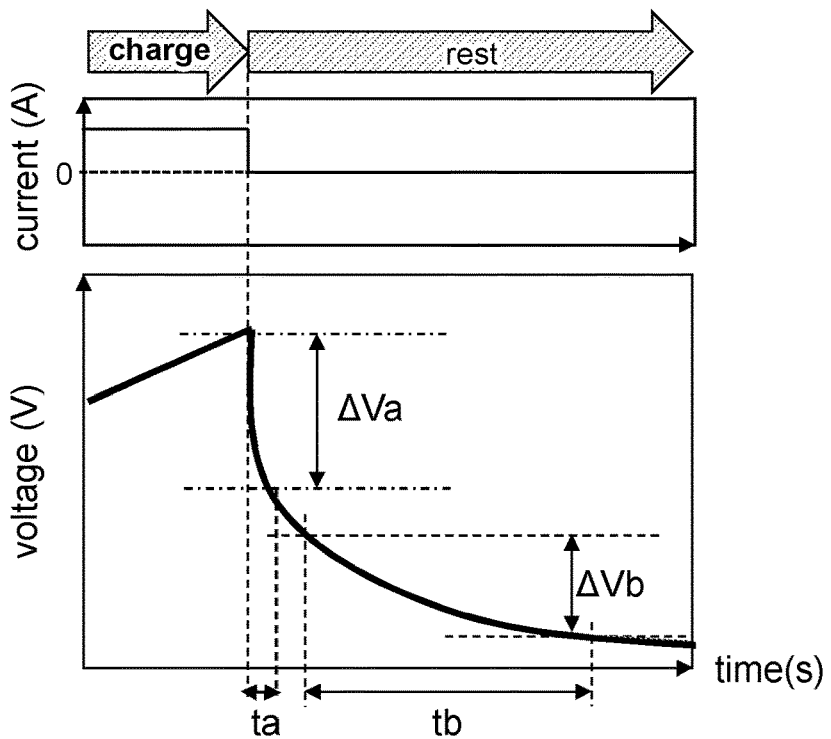
FIG. 19 is a graph illustrating a temporal variation of electrical current and voltage outputted from the battery 200 in a rest period after charging.

FIG. 19 is a graph illustrating a temporal variation of electrical current and voltage outputted from the battery 200 in a rest period after charging. ΔVa in S1702 may be a varied amount of output voltage of the battery 200 from a first start time point at or after the end of charge to a first time when a first duration ta has elapsed from the first start time point, instead of discharge. In this case, ΔVb in S1702 is a varied amount of output voltage of the battery 200 from a second start time point at or after the duration ta has elapsed to a second time when a second duration tb has elapsed from the second start time point. The author of this disclosure has found that ΔVa is correlated to Ri and ΔVb is correlated to SOH in the rest period after charging. Therefore, this embodiment can acquire ΔVa and ΔVb in S1702 after any one of charge or discharge.

FIG. 20 is a diagram illustrating a configuration and a data example of the relationship table 141. The relationship table 141 is a data table that defines each parameter in the equations 1 and 2. Since c_Ri_I and c_SOH_I vary with the output current of the battery 200, those parameters are defined for each of output current values. Since c_Ri_T and c_SOH_T vary with the temperature, those parameters are defined for each temperature. Since these parameters may have different characteristics between the rest period after discharge and the rest period after charge, the relationship table 141 defines each parameter for each of these periods. The relationship table 141 may be configured as a part of the relationship table described in the embodiments 1-3, or may be configured as separate data.

If $f_{Ri}$ is a first order function of ΔVa, Ri can be expressed by Equation 3 below, for example. This is because the slope of Ri is affected by temperature, and the intercept is affected by current. In this case, there are one pieces of c_Ri_T and c_Ri_I, respectively.

$$Ri = c\_Ri\_T\_1 \times \Delta Va + c\_Ri\_I\_1 \qquad (3)$$

If $f_{SOH}$ is a first order function of ΔVb, SOH can be expressed by Equation 4 below, for example. This is because the slope of SOH is affected by temperature, and the intercept is affected by current. In this case, there are one pieces of c_SOH_T and c_SOH_I, respectively.

$$SOH = c\_SOH\_T\_1 \times \Delta Vb + c\_SOH\_I\_1 \qquad (3)$$

Figure 21:
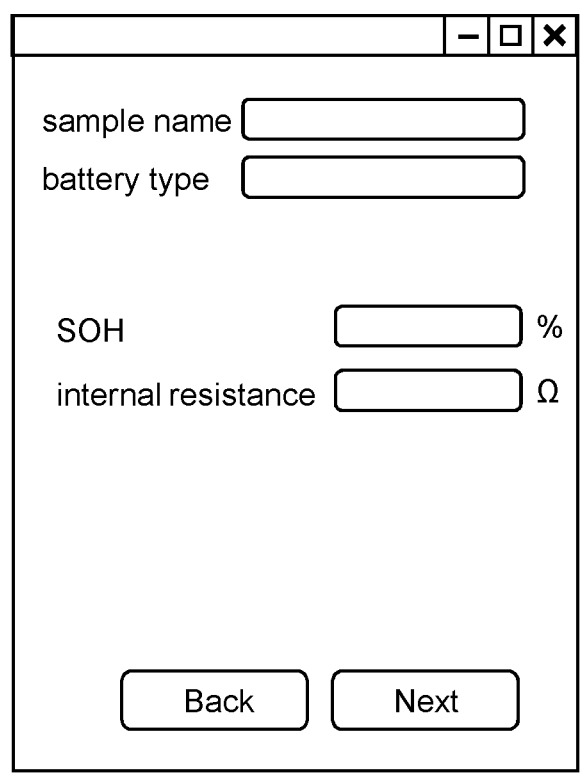
FIG. 21 is an example of a user interface presented by the battery state estimating device 100.

FIG. 21 is an example of a user interface presented by the battery state estimating device 100. The user interface can be presented on a display device, for example. The user interface presents calculated results by the processor 120. The user interface in FIG. 21 presents an estimates result for actually measured values of SOH and internal resistance of battery, respectively.

Modification of Present Disclosure

The present disclosure is not limited to the embodiments as described above, but includes various modifications. For example, the embodiments are described in detail for readily understanding of the present disclosure which is not necessarily limited to the one equipped with all structures as described above. It is possible to replace a part of the structure of one embodiment with the structure of another embodiment. The structure of one embodiment may be provided with an additional structure of another embodiment. It is further possible to add, remove, and replace the other structure to, from and with a part of the structure of the respective embodiments.

In the embodiments above, SOH or internal resistance are estimated in the rest period after discharging the battery. However, as long as a temporal change of output voltage appears which corresponds to them in the rest period after charging the battery, SOG or internal resistance can be estimated as in the embodiments above. It depends on the battery characteristic whether a voltage change appears which corresponds to SOH or internal resistance in the rest period after discharging, in the rest period after charging, or in both of them. Therefore, depending on the battery characteristic, SOH or internal resistance may be estimated in any one of them.

In the embodiments above, the battery state estimating device 100 and the battery 200 may be configured as an electric power grid system configured by a plurality of the batteries 200. The battery state estimating device 100 may estimate SOH or internal resistance of battery and may control the behavior of the battery. Alternatively, another device may control the battery 200.

REFERENCE SIGNS LIST

100: battery management device
110: communicator
120: processor
130: detector
140: storage unit
200: battery

The invention claimed is:

1. A battery state estimating device comprising:
   a detector that acquires a detected value of a voltage outputted from the battery; and
   a processor that estimates a state of the battery,
   wherein the processor identifies a first period from a first start time point at or after an end time point when the battery finishes charging or discharging to a first time point when a first duration has elapsed from the first start time point, wherein the processor identifies a second period from a second start time point at or after the first time point to a second time point when a second duration has elapsed from the second start time point, wherein the processor acquires, as a second period difference, a difference of the voltage from start of the second period to end of the second period, wherein the processor refers to data that describes a relationship between the second period difference and a state of health of the battery, thereby acquiring an estimated value of the state of health, wherein the processor acquired an actually measured value of the state of health that can be acquired by charging or discharging the battery, wherein the processor acquires a first correlation between the estimated value and the actually measured value by acquiring the estimated value and the actually measured value for each of degrees of degradation of the battery, and wherein the processor acquires again the second period difference after acquiring the first correlation and refers to the first correlation using the acquired second period difference, thereby estimating the actually measured value.

2. The battery state estimating device according to claim 1, wherein the processor acquires, as the actually measured value, the state of health that is defined according to a ratio between:
- a capacity change of the battery which is not degraded, when fully charging or fully discharging the battery; and
- a capacity change of the battery which is degraded, when fully charging or fully discharging the battery.

3. The battery state estimating device according to claim 1, wherein the processor acquires, as the actually measured value, the state of health that is defined according to a ratio between:
- a capacity change of the battery which is not degraded, when charging or discharging the battery such that the voltage changes from an upper limit voltage that is smaller than the voltage of fully charged to a lower limit voltage that is larger than the voltage of fully discharged; and
- a capacity change of the battery which is degraded, when charging or discharging the battery such that the voltage changes from the upper limit voltage to the lower limit voltage.

4. The battery state estimating device according to claim 1, wherein the processor acquires information that describes the actually measured value for each of plurality of the batteries that have states of health different from each other, thereby acquiring the actually measured value of each of the batteries, wherein the processor acquires the second period difference for each of the batteries, thereby acquiring the estimated value of each of the batteries, and wherein the processor acquires the first correlation using the actually measured value acquired for each of the batteries and using the estimated value acquired for each of the batteries.

5. The battery state estimating device according to claim 1, wherein the processor estimates the actually measured value according to the first correlation, for a reference battery that is degraded most among a plurality of the batteries that perform passive balance control, and wherein the processor corrects the actually measured value estimated for the reference battery, using a variation of the voltage when finishing charging or discharging each of the batteries, thereby estimating a state of health of an assembled battery formed by the plurality of the batteries.

6. The battery state estimating device according to claim 5, wherein the processor acquires the estimated value for each of the batteries, thereby calculating a first standard deviation of the estimated value, wherein the processor acquires the voltage when finishing charging or discharging each of the batteries, thereby calculating a second standard deviation of the voltage when finishing charging or discharging, wherein the processor acquires a second correlation between the first standard deviation and the second standard deviation, for each of degrees of degradation of the battery, wherein the processor acquires again the second period difference after acquiring the second correlation and refers to the second correlation using the acquired second period difference, thereby estimating the second standard deviation, and wherein the processor corrects the actually measured value estimated for the reference battery by the estimated second standard deviation, thereby estimating a state of health of the assembled battery.

7. The battery state estimating device according to claim 5, wherein the processor acquires, as a first period difference, a difference of the voltage from start to end of the first period, wherein the processor calculates, as a third standard deviation, a variation of internal resistance of each of the batteries using the first period difference acquired for each of the batteries, wherein the processor acquires the voltage during charging or discharging each of the batteries, thereby calculating a fourth standard deviation of the voltage during charging or discharging, wherein the processor acquires a third correlation between the third standard deviation and the fourth standard deviation for each of degrees of degradation of the battery, wherein the processor acquires again the third standard deviation after acquiring the third correlation and refers to the third correlation using the acquired third standard deviation, thereby estimating the fourth standard deviation, and wherein the processor corrects the actually measured value estimated for the reference battery by the estimated fourth standard deviation, thereby estimating a state of health of the assembled battery.

8. The battery state estimating device according to claim 1, wherein the processor acquires a state of health for each of a plurality of the batteries that perform active balance control, and calculates an average of the acquired states of health after removing outliers, thereby estimating a state of health of an assembled battery formed by the plurality of the batteries.

9. The battery state estimating device according to claim 1,
wherein the processor acquires, as a first period difference, a difference of the voltage from start to end of the first period, for each of plurality of batteries that perform active balance control,
wherein the processor acquires an internal resistance of each of the batteries using the first period difference acquired for each of the batteries, and
wherein the processor calculates an average of the acquired internal resistances after removing outliers, thereby estimating an internal resistance of an assembled battery formed by the plurality of the batteries.

10. The battery state estimating device according to claim 1, further comprising an user interface that presents the estimated actually measured value.

11. An electric power system comprising:
the battery state estimating device according to claim 1; and
the battery.

* * * * *